United States Patent [19]
Pilling et al.

[11] Patent Number: 6,130,563
[45] Date of Patent: Oct. 10, 2000

[54] OUTPUT DRIVER CIRCUIT FOR HIGH SPEED DIGITAL SIGNAL TRANSMISSION

[75] Inventors: David J. Pilling, Los Altos Hills; Raymond Chu, Saratoga, both of Calif.

[73] Assignee: Integrated Device Technology, Inc., Santa Clara, Calif.

[21] Appl. No.: 08/926,822

[22] Filed: Sep. 10, 1997

[51] Int. Cl.⁷ ..................................................... H03K 3/00
[52] U.S. Cl. ........................... 327/111; 327/112; 327/437
[58] Field of Search .................. 327/108–112, 374–377, 327/170, 434, 436, 437, 333; 326/82, 83, 86, 87

[56] References Cited

U.S. PATENT DOCUMENTS

| | | | |
|---|---|---|---|
| 4,719,369 | 1/1988 | Asano et al. | 326/86 |
| 5,023,488 | 6/1991 | Gunning | 326/86 |
| 5,028,818 | 7/1991 | Go Ang et al. | 326/87 |
| 5,134,311 | 7/1992 | Biber et al. | 327/108 |
| 5,216,289 | 6/1993 | Hahn et al. | 327/108 |
| 5,376,837 | 12/1994 | Nakano | 327/544 |
| 5,382,847 | 1/1995 | Yasuda | 326/87 |
| 5,430,404 | 7/1995 | Campbell et al. | 327/566 |
| 5,617,043 | 4/1997 | Han et al. | 326/87 |

*Primary Examiner*—Kenneth B. Wells
*Attorney, Agent, or Firm*—Skjerven Morrill MacPherson Franklin & Friel

[57] ABSTRACT

An output driver circuit capable of driving its data output terminal to a digital logic level high, capable of driving its data output terminal to a digital logic level low, and capable of tristating its data output terminal has an output stage comprising a pullup transistor and a pulldown transistor. The two pullup and pull down transistors are coupled in series between two drive transistor circuits. In one aspect of the invention, the pullup and pulldown drive transistor circuits provide momentary low impedance connection of the pullup and pulldown transistors to the respective pullup and pulldown voltage sources during the initial switching waveforms of the digital signal. After the initial switching of the digital signal, the pullup and pulldown drive transistor circuits provide precise $V_{OH}$ and $V_{OL}$ voltage output levels and provide high impedance filtering of voltage supply line and ground line noise. In another aspect of the invention, the high frequency response of the output is enhanced by auxiliary pullup and pulldown drivers in parallel with the pullup and pulldown output transistors. These auxiliary pullup and pulldown drivers reduce the switching time of the digital signal output to provide increased frequency response even in a high capacitance loaded environment.

12 Claims, 6 Drawing Sheets

OUTPUT DRIVER CIRCUIT FOR HIGH SPEED DIGITAL SIGNAL TRANSMISSION

CROSS-REFERENCE TO RELATED APPLICATIONS

The present application is related to commonly owned U.S. Pat. No. 5,430,404, issued Jul. 4, 1995 to Campbell et al., and to commonly owned U.S. Pat. No. 5,028,818, issued Jul. 2, 1991, to Go Ang et al., the disclosures of which are hereby incorporated by reference.

BACKGROUND OF THE INVENTION

1. Field of the Invention

The present invention relates to electronic circuitry suitable for use in a semiconductor integrated circuit. More specifically, this invention relates to a driver circuit for high speed digital signal transmission on a transmission line.

2. Description of the Related Art

Digital computers and the like often include a plurality of VLSI circuits which are interconnected for binary communications by single element or multisegment transmission lines (collectively referred to herein as "transmission lines"). Transmission lines include parallel conductors, coaxial cable, and, conventionally, electrically conductive traces formed on a suitable substrate, such as a printed circuit board. A transmission line, whatever its form, has a characteristic impedance such that a wave traveling along the line has a ratio of voltage to current equal to the characteristic impedance. Typically, printed circuit board traces and coaxial lines have impedances in the range of 50 to 100 ohms. When used with high frequency (or short rise/fall time) signals, it is important to "match" the load to the characteristic impedance of the line since a transmission line terminated with a load equal to its characteristic impedance (resistance) will transfer an applied pulse to the termination without reflection thus maximizing signal/power transfer to and from an attached load. Accordingly, standard practice terminates the opposite ends of the transmission line in their characteristic impedance, and VLSI circuits and other devices attached to the transmission line are series stub-terminated in order to match the impedance of an attached signal driver or receiver to the characteristic impedance of the transmission line. An output driver (sometimes called an "output buffer" or "signal line driver") is an electronic circuit that furnishes one or more output signals at voltage/current levels suitable to drive the transmission line to permit interfacing of the various VLSI components.

Special problems arise, however, when trying to send high-speed digital signals through transmission lines such as capacitive loading of the fast signals, common mode interference pickup, and signal reflections from impedance mismatching. As motherboards (a printed circuit board containing multiple edge connectors to accept individual circuit cards that make up the logic circuit) increase in complexity, and data and control bus clock speeds continue to increase, there is a corresponding increase in the capacitive loading on digital signal output drivers principally due to stray wiring capacitance and the input capacitance of the driving chips themselves. These all contribute to the load on the output driver. Consequently, in order to make a fast transition between logic states, the output driver must sink or source a large current into the transmission line in order to provide an output signal having logic high and logic low signals within their specified voltage ranges.

Conventional interface specifications between integrated circuits have resulted in manufacturers designing special circuitry to accommodate, or satisfy, these interface standards. However, as the number of intercard connections increases, and as backplane, or motherboard, complexity and bus speeds increase, capacitive loading for signal line drivers increases proportionally, such that conventional interface drivers can no longer meet the specified high and low logic signal voltage levels. Recognizing this problem, the Electronic Industry Association ("EIA") periodically releases new standards reducing the voltage swing required between high and low logic levels in order, thus somewhat mitigating the power requirements needed to accommodate the increased loading due to the inherent capacitance of the transmission line (for example, see EIA/JEDEC Standard No. 8-8), entitled "Stub Series Terminated Logic for 3.3 Volts (SSTL_3), A 3.3 V voltage based interface standard for digital integrated circuits"). In view of the relatively limited voltage swings associated with these reduced voltage standards, the voltage ranges corresponding to the high logic level voltage and the low logic level voltages are necessarily narrower.

A line signal driver capable of accommodating the high capacitive loads of high speed, multi-device transmission lines is shown in prior art FIG. 1. Multiple signal Gunning Transfer Logic (GTL) drivers 1 are shown attached to a transmission line 2 having a characteristic impedance of 50 ohms. The transmission line 2 is end terminated at its opposite ends with 50 ohm resistors 3 and 4 and lumped capacitances 5 and 6 are the equivalent of the stray wire and input capacitances which comprise the capacitive loading of the transmission line 2. Each of the GTL drivers 1 is stub terminated with a resistor 7 to match the characteristic impedance of transmission line 2. When all of the GTL drivers 1 are off, the transmission line 2 is pulled up to the 1.5 positive supply voltage shown by the impedance matching pullup resistors 3 and 4. However, when at least one GTL driver 1 is turned on, the voltage in transmission line 2 is reduced since the stub series resistors 7 create a voltage divider with pullup resistors 3 and 4. The new transmission line voltage is 1.5 volts times the ratio of the combined resistance of the stub-series resistors 7 associated with drivers currently ON, to the sum of the combined resistance of the stub termination resistors 7 of those drivers 1 that are turned ON and the pullup resistors 3 and 4. It is apparent that as increasing numbers of drivers 1 are turned ON, the combined resistance of the stub termination resistors becomes very small, thus dragging the nominal voltage of the transmission line 2 to a low value. Accordingly, as additional drivers turn on it becomes very difficult to distinguish the logic low level voltage from the nominal voltage level of the transmission line, the two voltages approaching ground, or zero volts, as the number of GTL drivers 1 that are turned on becomes large.

Output-stage current transients resulting from simultaneous biasing of the CMOS transistors, and voltage spikes, or ground bounce, associated with dumping large doses of current to ground when driving capacitive loads may still be introduced onto the transmission line 2. Even though the voltage is reduced to 1.5 volts in the transmission interface shown in FIG. 1, if the output stage of the amplifier (not shown) driving each of the GTL drivers 1 is a CMOS in a "totem-pole" output configuration with the pulldown transistor terminating to ground, substantial current may still be switched, and ground current noise introduced onto transmission line 2 from each driver 1 as it switches ON and OFF.

Elimination of ground bounce in an output driver is described by Campbell et al., in related issued U.S. Pat. No. 5,430,404. Campbell uses a charge rate control circuit for charging the gates of its pullup and pulldown output transistors at a first gate voltage for an initially rapid output transition rate, followed by a second gate voltage for a slower transition rate, thus minimizing overshoot and ringing of the output signal, as well as bounce on the voltage supply lines. Also, the output transistors include a bulk potential control circuit to change the voltage of the semiconductor bulk in which the FET is disposed resulting in a reduction of noise associated with ground bounce on the voltage supply lines.

In another related application by Go Ang et al., U.S. Pat. No. 5,028,818, a ground-bounce limiting circuit comprising a predriver circuit and a non-linear Miller capacitor between the drain and gate of an output driver is used to limit ground bounce. The Miller capacitor provides non-linear feedback between the gate and drain of the output driver to control the time-ramping of the output current of the output transistor.

Both the Campbell and Ang circuits describe reducing the generation of ground bounce noise by controlling the discharge rate of the pulldown output transistor. Neither circuit, however, describes protecting the driver from power supply or ground noise. Moreover, neither describes providing additional drive current during logic state transitions to provide high speed or high frequency signal capability on a high capacitance transmission line. Accordingly, there is a need for a signal line driver capable of providing stable high/low voltages at specified high/low logic states in a low voltage transmission line system comprising a transmission line having a specified null voltage value, and a plurality of signal line drivers. There is a further need for a signal line driver providing high frequency digital signal generation on a transmission line having a high inherent capacitance without substantial ground bounce, and capable of rejecting power supply noise.

SUMMARY OF THE INVENTION

In accordance with the present invention, an output driver circuit includes a drive control circuit, a rising edge detector and a falling edge detector to generate an output pulse of predefined duration, an auxiliary driver section for providing additional drive voltage to the output during an output voltage swing, and output transistors arranged in totem configuration between a pullup drive transistor circuit and a pulldown drive transistor circuit, the voltage supplies drive transistor circuits having output drive transistors capable of impedance modification during output voltage swings and being responsive to the output pulse from the edge detectors.

In one embodiment of the present invention, the output transistors are of opposite polarity arranged in totem-pole configuration and comprise a first transistor having a drain, and a source coupled to a data output terminal, and a gate electrode responsive to a first control signal. The second output transistor includes a drain coupled to the data output terminal, a source, and a gate electrode responsive to a second control signal. The first and second output transistors are typically insulated-gate devices such as N-channel and P-channel insulated-gate field effect transistors (FET). The drive control circuit controls the first and second output transistors by generating the appropriate first and second control signals in response to one or more digital input signals present on one or more data input terminals and/or in response to a digital enable/disable input signal present on an enable/disable input terminal. The enable/disable digital data input also tristate enables the line driver of this invention by suppressing digital signal output at the output terminal when the appropriate disable signal is expressed on the enable/disable terminal.

In accordance with a first aspect of this invention, a falling edge detector generates a pulse of predetermined pulse width in response to the falling edge of the first control signal generated by the drive control circuit. In one embodiment the falling edge detector is a one-shot comprising an inverter and a NOR gate. The pulse width is adjusted by adding additional inverters in series to provide an odd number of inverters. Similarly a second one shot comprising an inverter and a NAND gate is used as a rising edge detector to generate a pulse of predetermined width in response to the rising edge of the second control signal generated by the drive control circuit. As in the first one shot, the pulse width is adjusted by adding additional inverters in series to provide an odd number of inverters. The duration of the pulse width in both cases is less than the time required for the output voltage at the output terminal to transition from one logical voltage level to the other.

In accordance with a second aspect of the line driver of this invention, auxiliary output circuits provide additional drive to the digital output signal during the voltage swing of a logic level transition. During pullup, a first auxiliary driver, responsive to the output pulse of the falling edge detector one shot pulse, momentarily drives the output voltage at the output terminal to $V_{DD}$, the high supply source voltage. This voltage level is applied to the output terminal for a duration equal to the one shot output pulse width, and is less than the time required for the output voltage at the output terminal to transition from one logical voltage level to the other. Similarly, during pulldown, a second auxiliary driver, responsive to the output pulse of the rising edge detector one shot pulse, momentarily drives the output voltage at the output terminal to $V_{SS}$, the low supply source voltage. As in the first auxiliary drive circuit, this voltage level is applied to the output terminal for a duration equal to the one shot output pulse width, and is less than the time required for the output voltage at the output terminal to transition from one logical voltage level to the other. The auxiliary driver circuits provide additional boost to the output voltage signal during an output logic level transition to provide enhanced high frequency capability of the line driver of this invention even when the output terminal is under a high capacitive load. The auxiliary drivers are turned off once the one shot pulse expires.

In accordance with a third aspect of the line driver of this invention, a pullup drive transistor circuit, and a pulldown drive transistor circuit are provided between the pullup transistor and high level voltage supply source, $V_{DD}$, and the pulldown output transistor and the low level voltage supply source, $V_{SS}$, respectively. Responsive to the output pulse of the edge detecting one shots, these drive transistor circuits momentarily modify their respective output drive transistor impedance to bias their respective output transistors at approximately $V_{DD}$ for the pullup output transistor, and $V_{SS}$ for the pulldown output transistor. This increased bias voltage to the output transistors increases the current flow through the output transistors thus providing a faster transition time of the output signal between logic levels at the output terminal, even when the output terminal is under a high capacitive load.

The pulse widths of the one shot pulses are of a predetermined duration in order to provide only enough additional drive to the output signal for a duration less than the transition time for the voltage swing between logic states. The purpose of terminating the additional drive "boost" prior to reaching the logic level is to permit the output signal to approach the voltage of the logic level at a relatively slower rate to prevent overshoot, its resultant ringing, and to minimize current bounce. In this regard, the impedance of the pullup or pulldown output drive transistor increases after the one shot pulse has expired to permit a much slower discharge or charge of the output transistor as the signal approaches a logic low or high level. As a result, this slow discharge or charge eliminates ground bounce and line ringing. The pullup and pulldown drive transistor circuits also isolate the line from power supply or ground noise. Moreover, since the output terminal of the driver is isolated from the high and low voltage supply sources by the pullup and pulldown drive transistor circuits, the transmission line sees essentially a high impedance driver at all times except when there is a logic level transition of the output signal. At the time of switching, the impedance drops to the value of a stub series resistor placed in series to the driver to impedance match the driver with the transmission line thus ensuring efficient power transfer from the line driver to the transmission line during the short period of the logic level transition voltage swing. At all other times, including logic levels high and low, and in the tristate off mode, the driver of this circuit substantially removes itself as a load.

In accordance with a fourth aspect of the driver of this invention, at least one or more of the auxiliary driver transistors, the output drive transistors, and the output transistors may be selected from an on-die mask programmable array of transistor devices, either singly or in combination to service a wide range of capacitance loads. In one embodiment, mode bits set in internal registers may optionally be used to select at least one transistor according to the capacitive loading of the transmission line in order to vary the switching time or impedance of the driving transistors.

BRIEF DESCRIPTION OF THE DRAWINGS

The present invention may be better understood, and its numerous objects, features, and advantages made apparent to those skilled in the art by reference to the accompanying drawings.

The use of the same reference symbols in different drawings indicates similar or identical items.

DESCRIPTION OF THE PREFERRED EMBODIMENT(S)

While the invention is described hereinbelow with reference to certain illustrated embodiments, it is understood that these embodiments are presented by way of example and not by way of limitation. The intent of the following detailed description is to cover all modifications, alternatives and equivalents as may fall within the spirit and scope of the invention as defined by the appended claims. For example, it is understood by a person of ordinary skill practicing the device of this invention that equivalent circuits may be constructed using either bipolar, FET, or BiCMOS devices.

Figure 1:
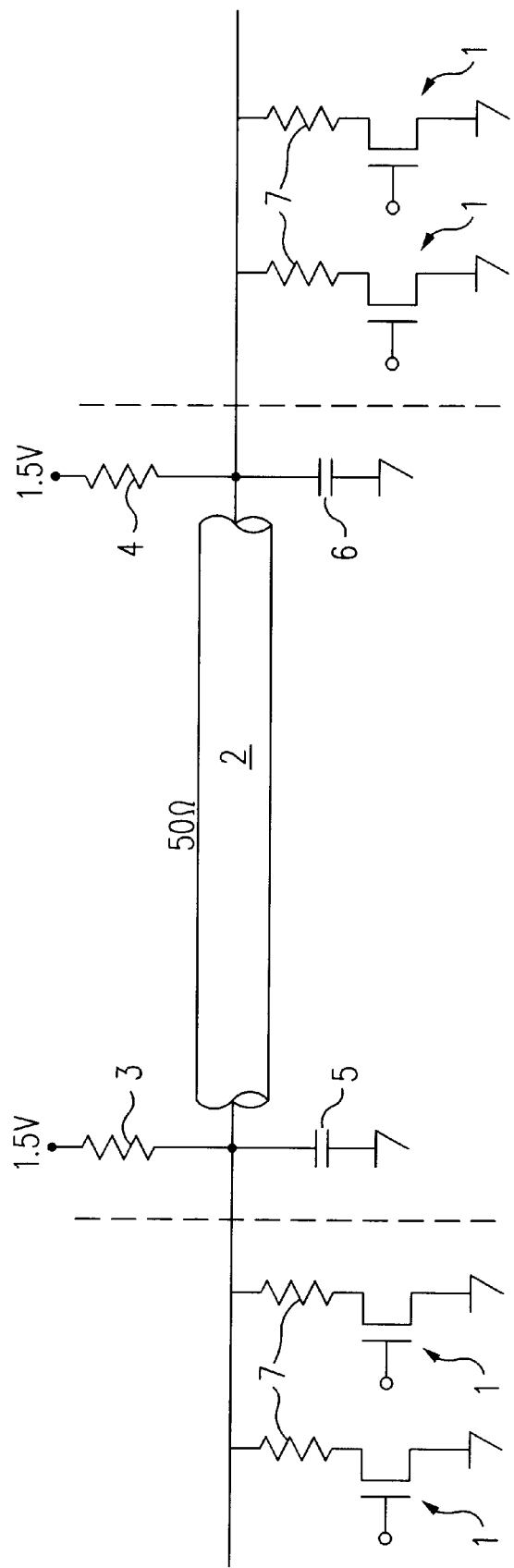
FIG. 1 is a schematic diagram illustrating the operating principles associated with high speed digital signal drivers attached to a transmission line as is presently practiced in the prior art.
Figure 2:
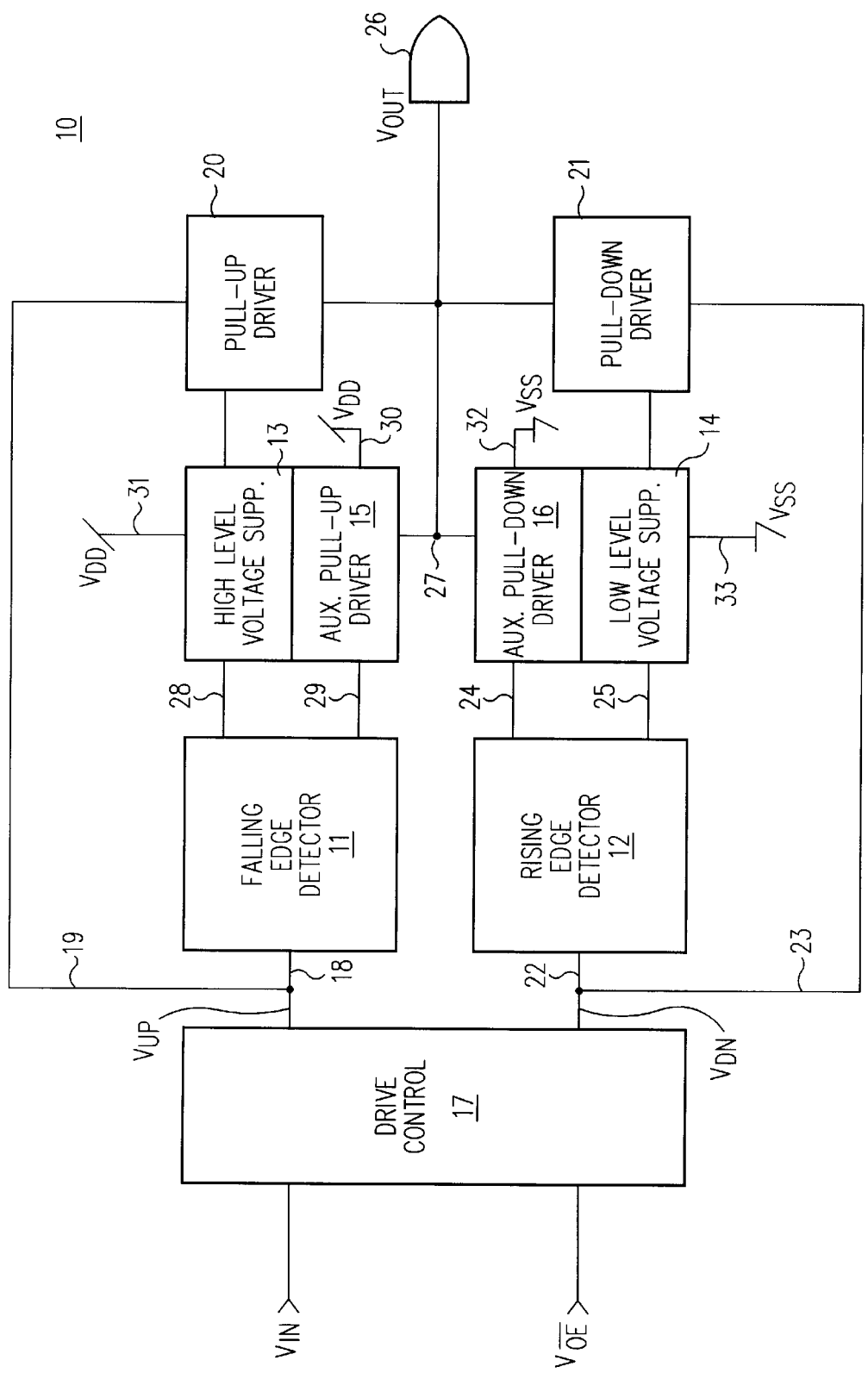
FIG. 2 is a conceptual systems level diagram showing the circuit subsystems comprising the driver circuit of this invention.

Turning now to the drawings, and in particular to FIG. 2, the driver circuit 10 of this invention is illustrated as a system of electrically connected subsystems, the subsystems comprising a falling edge detection circuit 11, a rising edge detection circuit 12, a pullup drive transistor circuit 13, a pulldown drive transistor circuit 14, an auxiliary pullup driver 15, an auxiliary pulldown driver 16, and pullup and pulldown drivers 20 and 21 respectively. The circuit 10 is rendered tristatable by the addition of a drive control circuit 17. Data output 26 is principally provided by the pullup and pulldown driver circuits 20 and 21. The various subsystems are operatively combined to provide a driver circuit 10 having enhanced high frequency characteristics, even in a high capacitance loaded environment.

The drive control circuit 17 receives digital logic data signal $V_{IN}$ and digital logic enable/disable signal $V_{\overline{OE}}$ as inputs. Control digital logic data signal $V_{UP}$ is outputted on lines 18 and 19 for input to the falling edge detector 11, and to pullup driver 20, respectively. Control digital logic data signal, $V_{DN}$, is outputted on lines 22 and 23 for input to the rising edge detector 12, and to pulldown driver 21, respectively. Control digital logic signals $V_{UP}$ and $V_{DN}$ signals initiate the edge-triggered detector circuits 11 and 12 via lines 18 and 22 respectively causing the appropriate one of the detectors to produce a pulse of predefined duration. These pulses, in turn, activate auxiliary drivers 15 and 16 which supply additional drive to the switching waveforms to enhance switching frequency response. These pulses also impedance modify the output drive transistors in drive transistor circuits 13 and 14 thus biasing output drivers 20 and 21 to the full voltage value of the supply voltages $V_{DD}$ and $V_{SS}$, respectively.

The rising edge detector 12 detects only a low-to-high transition, or rising edge, of control digital logic data signal $V_{DN}$, whereupon it sends out a pulse having a preselected pulse width on lines 24 and 25. The pulse duration is selected to be less than the maximum rise time required for the high-to-low voltage swing of the output signal $V_{OUT}$ at output 26. The purpose of the pulse is to momentarily switch on auxiliary pulldown driver 16, which immediately pulls down output node 27 to the voltage value of the low level supply source voltage, $V_{SS}$ thus increasing the slew rate of the output signal $V_{OUT}$ during a high to low output voltage swing. Additionally, the output pulse from rising edge detector 12 momentarily impedance modifies the output drive transistor in pulldown drive transistor circuit 14 for the duration of the pulse so that so that the pulldown driver 21 is biased to the voltage value of the low level supply source voltage $V_{SS}$. Accordingly, the purpose of the rising edge detector is to increase the slew rate of the output voltage signal 26 during a high to low output voltage swing, thus enhancing the frequency response of the driver circuit of this invention.

In a similar manner, the falling edge detector 11 detects only a high-to-low transition, or falling edge, of control digital logic data signal $V_{UP}$, whereupon it sends out a pulse having a preselected pulse width on lines 28 and 29. The pulse duration is selected to be less than the maximum time required for the low-to-high voltage swing of the output signal $V_{OUT}$ at output 26. The purpose of the pulse is to momentarily switch on auxiliary pullup driver 15, which immediately pulls the output node 27 up to the voltage value of the positive supply source voltage, $V_{DD}$, thus increasing the slew rate of the output signal $V_{OUT}$ during a low to high output voltage swing. Additionally, the output pulse from falling edge detector 11 momentarily impedance modifies the output drive transistor in pullup drive transistor circuit 13 for the duration of the pulse so that the pullup driver 20 is biased to the voltage value of the high level supply source voltage $V_{DD}$. Accordingly, the purpose of the falling edge detector 11 is to increase the slew rate of the output during a low-to-high voltage swing, thus further enhancing the frequency response of the driver circuit of this invention.

Electrical power to drive circuit elements on the die is supplied from an external source (not shown) which provides an external high supply source voltage, $V_{DD}$, and an external low supply source voltage $V_{SS}$. High supply source voltage lines are connected to the auxiliary pullup driver via line 30 and to the pullup drive transistor circuit 13 via line 31. Similarly, the low supply source voltage line is connected to the auxiliary pulldown driver via line 32, and to the pulldown drive transistor circuit 14 via line 33. The output voltage of output drivers 20 and 21 is limited by the pullup drive transistor circuit 13 to a high logic voltage level, $V_{OH}$, and the pulldown drive transistor circuit 14 to a low logic voltage level $V_{OL}$.

Figure 3:
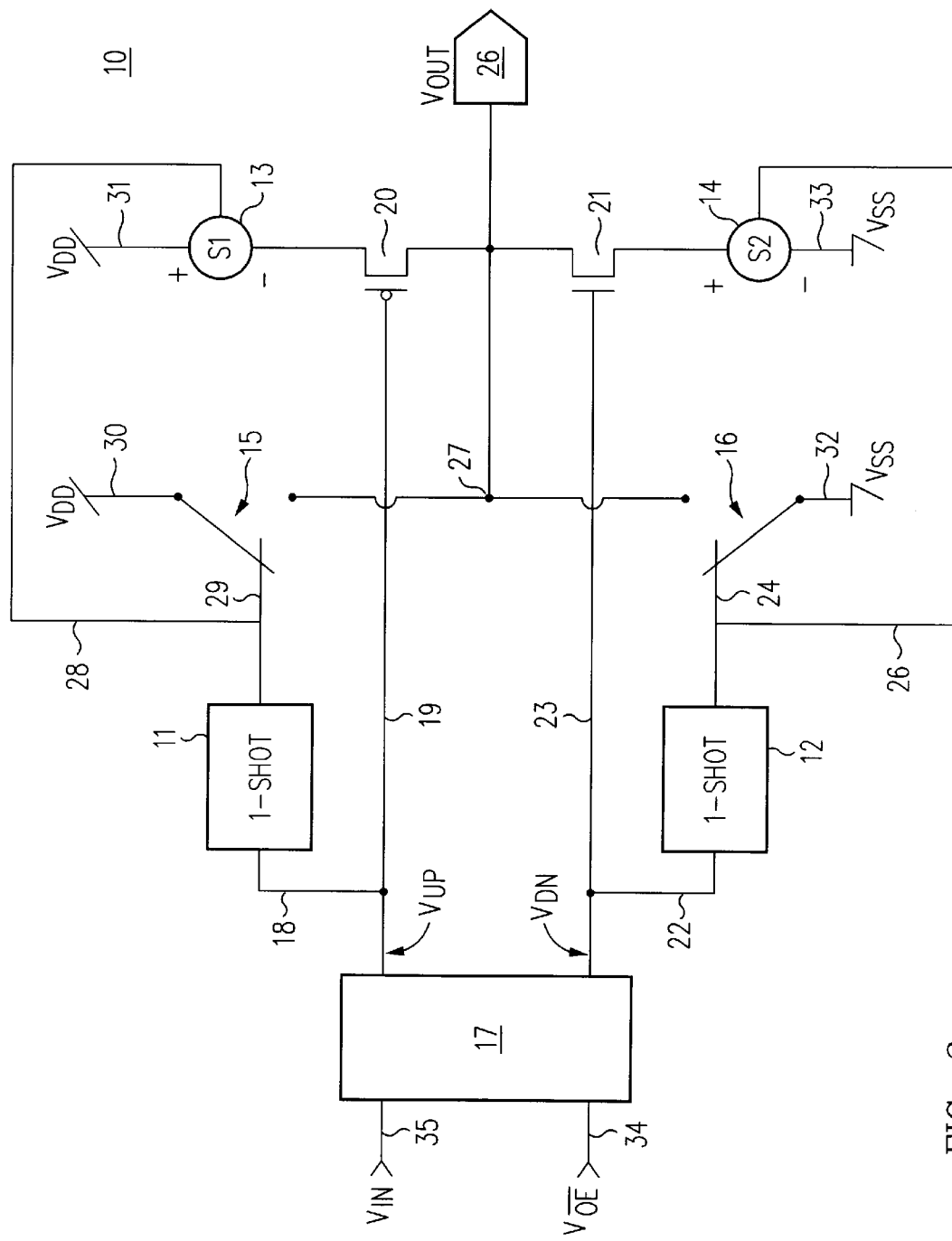
FIG. 3 is a conceptual diagram showing the operation of the circuit subsystems of the driver circuit of this invention.

A conceptual representation of one embodiment of the output driver circuit of this invention is shown in FIG. 3. Pullup driver 20 comprises an output P-MOSFET and pulldown driver 21 comprises an N-channel MOSFET transistor, the transistors 20 and 21 being connected in totem-pole, or push-pull, configuration between pullup and pulldown drive transistor circuits 13 and 14, respectively. Control voltage signals $V_{UP}$ and $V_{DN}$ are furnished to the gate electrodes of the output transistors 20 and 21 respectively by drive control circuit 17 One-shots 11 and 12 comprise the falling edge and rising edge detection circuits for detecting the rising and falling edges of control signals $V_{UP}$ and $V_{DN}$. Responsive to the pulse output of the edge detection circuits, an auxiliary pullup driver and an auxiliary pulldown driver, conceptually shown as switches 15 and 16, respectively, are momentarily closed for the duration of the respective one-shot output pulse to maximize the voltage swing rate of the output at output node 27 and correspondingly at output terminal 26. Both pullup drive transistor circuit 13 and pulldown drive transistor circuit 14 are also in electrical communication with the one-shot edge detection circuits via lines 28 and 25 respectively. When an edge is detected, the output drive transistor in the appropriate drive transistor circuit responds by momentarily reducing its impedance and biasing its respective output transistor at the full potential of the high level or the low level supply source voltage, $V_{DD}$ or $V_{SS}$. This increases the gate-source/drain voltage difference at the output transistor 20 and 21 resulting in greater current and, therefore, a higher slew rate of the output transistors 20 and 21.

By way of operation, the output driver circuit 10 of FIG. 3 receives input digital data signals $V_{IN}$ and $V_{\overline{OE}}$, each of which switch between low and high digital logic voltage levels. The digital logic signal $V_{\overline{OE}}$ is present on terminal 34 and either enables or disables the driver circuit 10. In the embodiment shown, the signal $V_{IN}$ present at the data terminal 35 controls control digital logic data signals $V_{DN}$ and $V_{UP}$ to between a low logic level and a high logic level such that both are high or both are low when driver circuit 10 is enabled. In the configuration shown in FIG. 3, the drive control circuit, when enabled, inverts the input digital logic signal of $V_{IN}$ so that a high logic level input results in $V_{UP}$ and $V_{DN}$ going low, thus turning on the pullup P-channel output transistor 20 via line 19, and turning off the pulldown N-channel transistor 21 via line 23. When control digital logic signal $V_{UP}$ transitions from a high to a low logic level (corresponding to $V_{IN}$ transitioning from a low to a high logic level), falling edge detector one shot 11 generates an output pulse of predetermined pulse width on lines 28 and 29. The effect of the pulse is to momentarily impedance modify pullup drive transistor circuit 13, thus biasing pullup driver 20 to a voltage approximately equal to $V_{DD}$, and to momentarily enable switch 15 thus driving output node 27, and consequently $V_{OUT}$, to a voltage level approximately equal to $V_{DD}$. Both of these momentary events are timed by the one-shot 11 output pulse for the purpose of increasing the slew rate of the output driver 20, thus improving the frequency response of a low to high voltage swing at output 26. The one-shot pulse is of a predetermined duration sufficient to drive the output 26 during most of the rise time of the rising edge of the output signal, but short enough to permit a gradual rise to the high logic voltage level of the output signal by a slow charge from the now high impedance pullup output drive transistor in pullup drive transistor circuit 13. This gradual rise prevents or substantially reduces ringing associated with too fast a rise time and overshoot of the output high logic level voltage. A mirror-image process occurs when $V_{DN}$ transitions from a low to a high digital signal logic level, resulting in an increased slew rate of the falling edge of the output signal, $V_{OUT}$.

When the input digital logic signal $V_{IN}$ is low, both control signals $V_{UP}$ and $V_{DN}$ are high, thus turning off the P-channel pullup output transistor 20 and turning on the pulldown N-channel output transistor 21. The driver circuit 10 is in a tristate off condition when $V_{UP}$ is either high or low, and $V_{DN}$ is either low or high.

Figure 4:
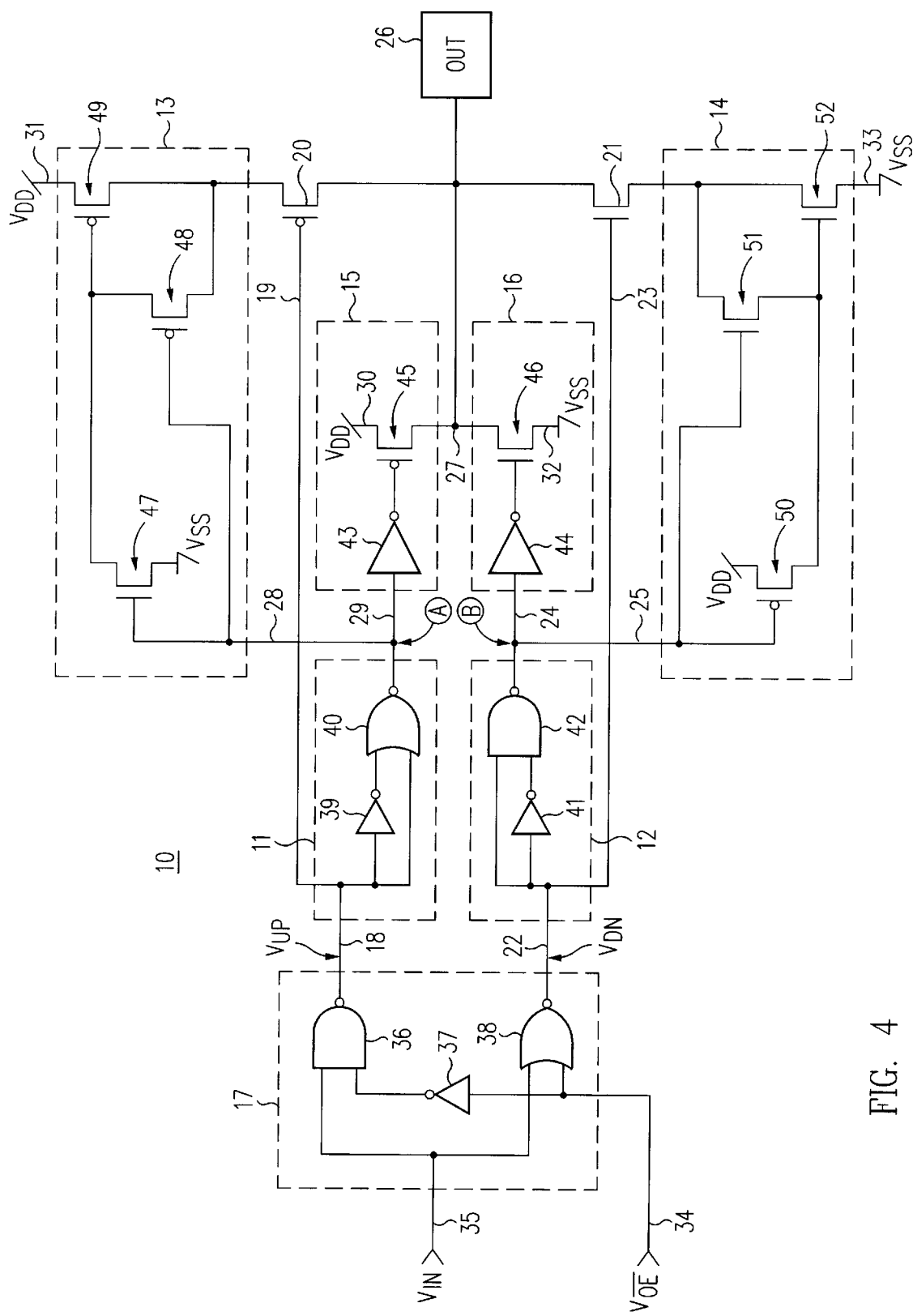
FIG. 4 is a circuit diagram of one embodiment of the driver circuit of this invention.

FIG. 4 is a schematic diagram of the embodiment shown in FIG. 3 and includes drive control circuit 17, falling edge detector one-shot 11, rising edge detector one-shot 12, auxiliary pullup driver 15, auxiliary pulldown driver 16, pullup drive transistor circuit 13, pulldown drive transistor circuit 14, pullup output transistor 20, and pulldown output transistor 21. The operational truth table is presented in Table I below.

TABLE I

| | | | | | | | | | | | | |
|---|---|---|---|---|---|---|---|---|---|---|---|---|
| Pwr. | $V_{IN}$ | $V_{\overline{OE}}$ | $V_{UP}$ | $V_{DN}$ | A | B | 20 | 21 | 45 | 46 | 49 | 52 | $V_{OUT}$ |
| ON | L | L | H | H | L | P-L | OFF | ON | OFF | P-ON | S1 | P-ON | $V_{SS}$ + 0.7 |
| ON | L | H | H | L | L | H | OFF | OFF | OFF | OFF | S1 | S2 | Z |
| ON | H | L | L | L | P-H | H | ON | OFF | P-ON | OFF | P-ON | S2 | $V_{DD}$ − 0.7 |

TABLE I-continued

OPERATIONAL TRUTH TABLE

| Pwr. | $V_{IN}$ | $V_{\overline{OE}}$ | $V_{UP}$ | $V_{DN}$ | A | B | 20 | 21 | 45 | 46 | 49 | 52 | $V_{OUT}$ |
|---|---|---|---|---|---|---|---|---|---|---|---|---|---|
| ON | H | H | H | L | L | H | OFF | OFF | OFF | OFF | S1 | S2 | Z |
| OFF | DC | DC | DC | DC | DC | DC | OFF | OFF | OFF | OFF | OFF | OFF | Z |

The above table summarizes the operation of the drive circuit 10 of this invention in providing the logic high and low output voltage levels. In this table, "H" and "L" respectively denote logic level high and low levels. "DC" denotes a "don't care" condition. "Z" denotes that data output terminal 26 is to be in a tristate mode. "P-H" and "P-L" denote a high logic level pulse and a low logic level pulse as outputted by the falling edge and rising edge detectors respectively. "P-ON" denotes a pulsed on state for the specified device. "S1" and "S2" denote the normal, non-modified impedance states of pullup output drive transistor 49 and pulldown output drive transistor 52, respectively.

Drive control circuit 17 includes inverter 37 and NAND gate 36 to provide control digital logic data signal $V_{UP}$ on line 18, and NOR gate 38 in operative combination with inverter 37, to provide control digital logic data signal $V_{DN}$ on line 22. The logic level values of $V_{UP}$ and $V_{DN}$ are dependent upon the logic levels of $V_{IN}$ on terminal 35, and $V_{\overline{OE}}$ on terminal 34.

Falling edge detector one-shot 11 receives the control digital logic data signal, $V_{UP}$, and includes inverter 39 and NOR gate 40. As can be seen in Table I, one-shot 11 will only produce a high logic level pulse at node A (lines 28 and 29) when the value of $V_{UP}$ transitions from a high level logic value to a low level logic value. For all other $V_{UP}$ states including high and low logic levels, and low to high logic level transitions, the output of one shot 11, and consequently the logic level of node A, remains in a low logic state. The width of the one-shot output pulse is determined by the intrinsic latency of inverter 39. In the driver circuit 10 of this invention, the inverter latency is preselected to provide an output pulse at node A having a duration just less than the rise time required for pullup transistor 20 to swing the output $V_{OUT}$ from a low logic level, $V_{OL}$, to a high logic level, $V_{OH}$. The single inverter 39 shown may be expanded to an odd number of inverters to extend the pulse width to the desired duration.

Rising edge detector one-shot 12 receives the control digital logic data signal, $V_{DN}$, and includes inverter 41 and NAND gate 42. As indicated in Table I, one-shot 12 will only produce a low level logic pulse at node B (lines 24 and 25) when the value of control signal $V_{DN}$ transitions from a low level logic value to a high level logic value. For all other $V_{DN}$ states including high and low logic levels, and high to low level logic transitions, the output of one shot 12, and consequently the logic state of node B, remains in a high logic level state. As in the falling edge detector one-shot 11, the width of the rising edge detector one-shot 12 output pulse is determined by the intrinsic latency of inverter 41 and is preselected to provide an output pulse at node B having a duration just less than the fall time required for pulldown transistor 21 to swing the output $V_{OUT}$ from a high level logic state, $V_{OH}$, to a low logic level state, $V_{OL}$. As in one shot 11, the single inverter 41 shown may be expanded to an odd number of inverters to extend the pulse width to the desired duration.

Auxiliary pullup driver 15 receives the high level output pulse from falling edge detector one shot 11 to momentarily drive output node 27 and the output voltage, $V_{OUT}$, to approximately $V_{DD}$, the positive supply voltage. Inverter 43 inverts the high level logic pulse to provide a low level logic pulse signal to the gate of P-channel MOSFET 45, causing it to momentarily turn on thus pulling up the potential of node 27 and $V_{OUT}$ at node 26 to approximately $V_{DD}$. The pullup auxiliary driver remains on only for the duration of the falling edge detector one shot pulse. As discussed above, the pulse width of the one-shot pulse is predetermined to be just less than the rise time for an output signal at $V_{OUT}$ to swing from a low level logic signal to a high level logic signal. In accordance with one aspect of this invention, the additional drive provided to the output signal, $V_{OUT}$, by auxiliary pullup driver 15 increases the high frequency capability of driver circuit 10 even in a high capacitance loaded transmission line environment.

Similarly, auxiliary pulldown driver 16 receives the low level output pulse from rising edge detector one shot 12 to momentarily drive the output voltage, $V_{OUT}$, to approximately $V_{SS}$, the negative supply voltage. Inverter 44 inverts the low level logic pulse to provide a high level logic pulse signal to the gate of NMOS 46 causing it to momentarily turn on thus pulling down the potential of node 27 and $V_{OUT}$ to approximately $V_{SS}$. The pulldown auxiliary driver remains on for the duration of the rising edge detector one shot pulse, the width of which is predetermined to be just less than the fall time for an output signal at $V_{OUT}$ to transition from a high level logic signal, $V_{OH}$, to a low level logic signal, $V_{OL}$. The voltage "boost" provided to the output signal by auxiliary pulldown driver 16 also contributes to in an increase in the high frequency capability of driver circuit 10.

The frequency response of the driver circuit 10 of this invention is further enhanced by momentarily "bypassing" drive transistor circuits 13 and 14 by modifying the impedance of output driver transistors 49 and 52. The high level output pulse from falling edge detector one shot 11 turns on NMOS 47 and turns off PMOS 48 causing the gate voltage of PMOS 49 to be approximately at $V_{SS}$, the potential of the negative supply source. This immediately places PMOS 49 well within its ON, or conductive, state thus immediately biasing output PMOS 20 at approximately $V_{DD}$, the potential of the high level supply source, to permit increased current flow through output transistor 20.

In a similar manner, the high level output pulse from rising edge detector one shot 12 turns on PMOS 50 and turns off NMOS 51 causing the gate voltage of NMOS 52 to be approximately at $V_{DD}$, the potential of the positive supply source. This immediately places NMOS 52 well within its ON, or conductive, state thus immediately biasing output NMOS 21 at approximately $V_{SS}$, the potential of the negative supply source, to permit increased current flow through output transistor 21.

The duration of this direct biasing of output transistors 20 and 21 to approximately the value of $V_{DD}$ and $V_{SS}$, respectively, is substantially equal to the duration, or pulse width, of the logic output pulse signals from falling edge and rising edge detector one shots 11 and 12. As this pulse width has been preselected to be just under the rise and fall times of the output signal, $V_{OUT}$, during a logic level transition, the momentary, additional voltage "boost" resulting from biasing the output transistors 20 and 21 to substantially the same voltages as the positive and negative source supply voltages results in an increase in the high frequency capability of driver circuit 10, even in a high capacitance loaded environment. This boost, in addition to the momentary additional voltage drive provided by auxiliary pullup and pulldown driver circuits 15 and 16, enables the driver circuit of the this invention to exhibit good high frequency performance even in a transmission line system having high inherent capacitance.

The duration of the output pulses from edge detector one-shots 11 and 12 are predetermined to terminate before the peak output voltage level, $V_{OH}$ or $V_{OL}$, of a voltage swing is attained. At that time, the additional voltage boost from auxiliary pullup and pull down drivers 15 and 16, and from impedance modified pullup and pulldown output drive transistors 49 and 52 ceases, causing the last or final portion of the voltage swing as it approaches $V_{OH}$ or $V_{OL}$ to occur at a much reduced rate. This relatively gradual swing rate during the final portion of an output voltage swing prevents "overshooting" the peak output voltage and eliminates resulting "ringing" associated therewith.

In the absence of an output pulse from falling edge detector one shot 11, NMOS 47 is off and PMOS 48 is on, thus clamping the gate of PMOS 49 to its drain. Where the voltage drop across the drain and gate of transistor 49 approximately equal to the threshold voltage of the device, its impedance is high and the source to drain current approaches zero. In this configuration, transistor 49 approaches its non-conductivity state, during which output transistor 20 is on, drawing current from the high level supply, and causing the gate to drain voltage difference across transistor 49 to exceed its threshold voltage. Since the threshold voltage of PMOS 49 is typically approximately 0.7 volts, output transistor 20 will be biased at its source at $V_{DD}$ minus 0.7 volts. This establishes the peak output voltage $V_{OH}$ for the high logic level at 0.7 volts less than $V_{DD}$. This is advantageous for low voltage circuits such as 3.3 volt circuits in that the maximum high level output voltage of the driver circuit of this invention is squarely within the standardized output voltage range corresponding to a high logic level as specified by EIA standard EIA/JESD8-8 entitled "Stub Series Terminated Logic for 3.3 Volts (SSTL_3)." It is understood that the voltage drop across transistor 49 may be adjusted by changing the threshold voltage of the transistor 49.

Similarly, in the absence of an output pulse from rising edge detector one shot 12, PMOS 50 is off and NMOS 51 is on, thus clamping the gate of NMOS 52 to its drain. If the voltage drop across the drain and source terminals of transistor 50 is approximately equal to the threshold voltage transistor 52, the impedance goes high and the source to drain current of transistor 52 approaches zero. Since the threshold of NMOS 52 is typically approximately 0.7 volts, output transistor 21 will be biased at its source at $V_{SS}$ plus 0.7 volts. This establishes the peak output voltage for the low logic level at 0.7 volts above than $V_{SS}$, well within the standardized output voltage range corresponding to the low logic level as specified by EIA standard EIA/JESD8.

Figure 5:
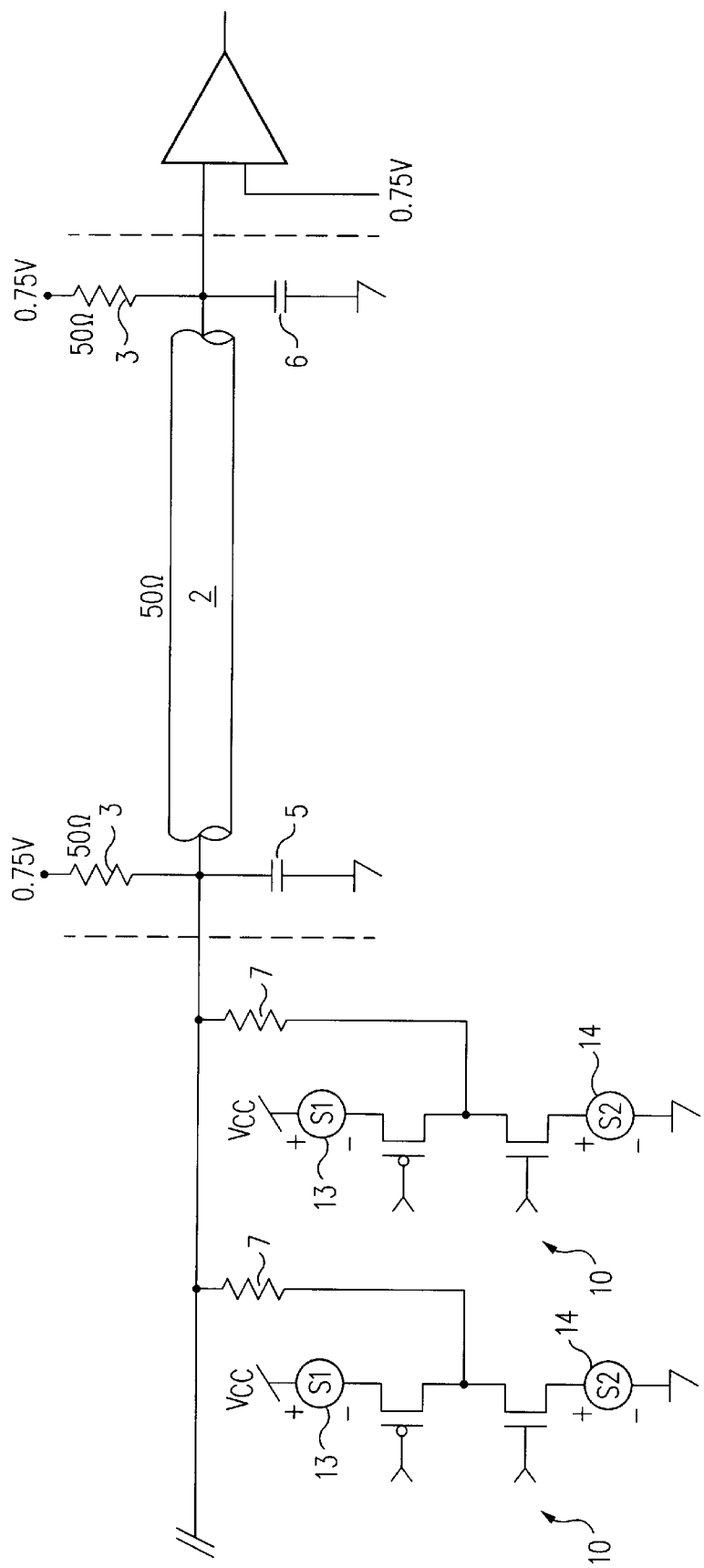
FIG. 5 is a schematic diagram showing a plurality of the driver circuits attached to a transmission line.

The impedance characteristic of a transistor with its drain and gate terminals shorted reaches a maximum as the source to drain current approaches zero. The power supplies 13 and 14 of this invention exhibit two important characteristics as a result of drain and gate terminals of PMOS 49 and NMOS 52 being clamped by transistors 48 and 51 respectively. First, there is a slow discharging or charging as the external signal approaches a logic high or low, thus eliminating ground bounce and line ringing; and second, the high impedance output drive transistor isolates the line from power supply or ground noise. A plurality of drive circuits 10 of this invention are conceptually shown in FIG. 5 attached between a transmission line 2 The output voltage swing for each driver 10 is limited by drive transistor circuits 13 and 14. Unlike the GTL line drivers of the prior art, the transmission line null voltage, shown as 0.75 volts, remains substantially unaffected by the number of line drivers 10 of this invention inserted into the transmission line 2.50 ohm line termination resistors 3 provide impedance matching at the opposite ends of the transmission line 2 and bumped capacitors 5 and 6 represent the equivalent stray wire and device input capacitance of the system including the transmission line and all attached devices. Stub series resistors 7 terminate each driver 10 to impedance match each drive to the transmission ensuring efficient power transfer.

Figure 7:
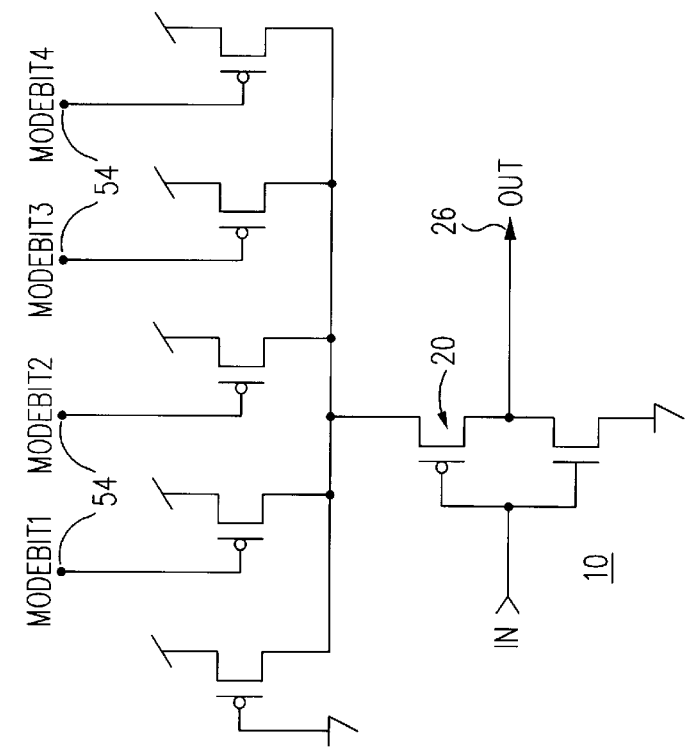
FIG. 7 is a schematic diagram showing one embodiment of a programmable voltage source driver for the pullup transistor portion of the driver circuit of the present invention.
Figure 6:
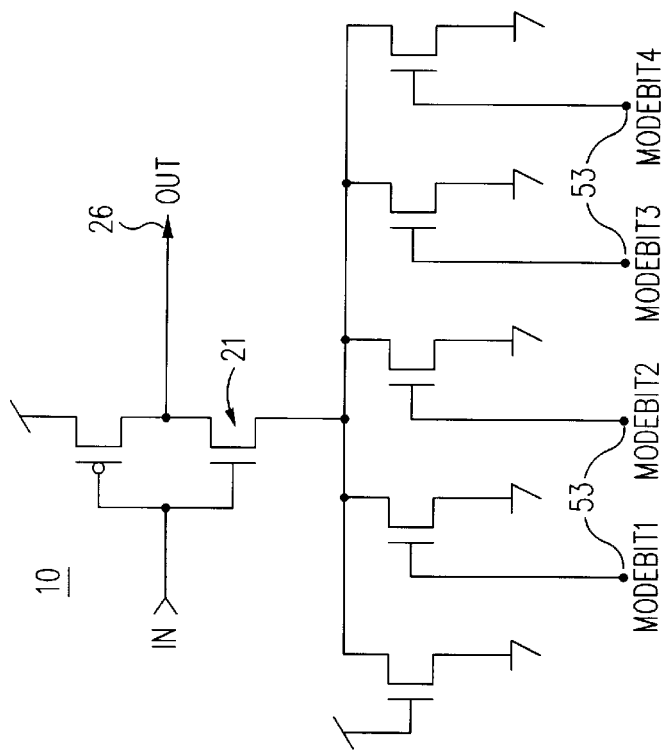
FIG. 6 is a schematic diagram showing one embodiment of a programmable voltage source driver for the pulldown transistor portion of the driver circuit of the present invention.

Output transistors including 45, 46, 20, and 21, as well as output drive transistors 49 and 52 must be capable of switching high current levels in accordance with the capacitive loading of the transmission line or backplane into which the driver circuit 10 is inserted. One aspect of the drive circuit of this invention is to optionally make these transistors mask programmable thus providing a selection of transistors in order to accommodate a range of capacitive loads. FIG. 6 shows an example of the output portion of the driver circuit 10 of this invention. The drive on pulldown output transistor 21 can be increased by setting mode bits 53 whereby a drive transistor of sufficient current carrying capacity may be selected. The mirror image arrangement is shown in FIG. 7 whereby the drive on pullup transistor 20 may be selected by setting mode bits 54. It is understood that a similar configuration for selecting auxiliary driver transistors 45 and 46, and for selecting output transistors 20 and 21, may also be provided as a mask programmable array, the specific devices being chosen singly or in parallel by setting mode bits from external registers.

The line driver circuit of this invention has been illustrated by way of specific embodiments using P-MOS and N-MOS devices which is consistent with a CMOS implementation. It is understood that the driver of this invention may be practiced using other devices instead of, or in combination with these devices including, but not limited to bipolar, and BiCMOS devices.

In view of the foregoing, it will be understood that the present invention provides a tristate enabled, mask programmable transmission line driver for use in transmission line environments having high capacitive loads. It will also be evident that the driver of this invention provides high frequency transmission capability by employing one-shot circuits as edge detectors to enable auxiliary circuits to supply additional drive to the initial switching waveforms, and to enable modifying the impedance of the pullup and pulldown voltage supplies during the charging and discharging times thus providing maximum current flow to the output transistors. It will be further evident that the high impedance pullup and pulldown voltage supplies provide stable high/low voltage levels of the digital output signal in a low voltage system by advantageously using the natural voltage drop across drive transistors having their gate and drain clamped by a transistor diode. The voltage supplies also provide a high impedance voltage source to isolate the driver from power supply and ground noise. The high impedance voltage supplies also permit insertion of a plurality of the drivers of this invention onto a transmission line without substantially increasing the capacitive loading, or affecting the null voltage of the transmission line.

What is claimed is:

1. An output driver coupled to a voltage supply source, comprising in operative combination:
   a) a drive control circuit for generating at least one control signal responsive to at least one digital input signal;
   b) at least one digital signal logic level switching detector to provide an output pulse of predetermined duration upon detecting at least one of a rising edge and a falling edge of said at least one control signal;
   c) at least one driver circuit to provide an output signal of said output driver; and
   d) at least one drive transistor circuit disposed between said voltage supply source and said driver circuit and coupled to an output terminal of said digital signal logic level switching detector, said drive transistor circuit comprising an output drive transistor coupled in series with said driver circuit, said output drive transistor being responsive to said pulse and having a first high impedance state in the absence of said pulse, and a second low impedance state when said pulse is present.

2. An output driver coupled to a voltage supply source, comprising in operative combination:
   a) at least one digital signal logic level switching detector to provide an output pulse of predetermined duration upon detecting at least one of a rising edge and a falling edge of a digital logic signal;
   b) at least one driver circuit to provide an output signal of said output driver;
   c) at least one drive transistor circuit disposed between said voltage supply source and said driver circuit and coupled to an output terminal of said digital signal logic level switching detector, said drive transistor circuit comprising an output drive transistor coupled in series with said driver circuit, said output drive transistor being responsive to said pulse and having a first high impedance state in the absence of said pulse, and a second low impedance state when said pulse is present; and
   d) at least one auxiliary output driver, said auxiliary driver having a first OFF state when said pulse is not present, and a second ON state when said pulse is present, said auxiliary driver for charging an output terminal of said output driver to approximately an output logic level value.

3. The output driver of claim 1 wherein said digital signal logic level switching detector is a one-shot.

4. An output driver coupled to a high level voltage supply source and a low level voltage supply source, comprising in operative combination:
   a) a drive control circuit for generating first and second control signals responsive to at least one digital input signal, each of said first and second control signals having a first high digital logic level and a second low digital logic level;
   b) a falling edge detector coupled to said drive control circuit for detecting the falling edge of said first control signal for generating thereupon a first pulse having a predetermined pulse width;
   c) a rising edge detector coupled to said drive control circuit for detecting the rising edge of said second control signal for generating thereupon a second pulse having a predetermined pulse width;
   d) a pullup transistor circuit coupled to said first control signal for providing a high logic level signal to an output in accordance with a predetermined digital logic level of said first control signal, said pullup transistor circuit comprising a pullup transistor;
   e) a pulldown transistor circuit coupled to said second control signal for providing a low logic level signal to an output in accordance with a predetermined digital logic level of said second control signal, said pulldown transistor circuit comprising a pulldown transistor;
   f) a first drive transistor circuit disposed between said high level voltage supply source and said pullup transistor circuit, said drive transistor circuit being coupled to said pullup transistor circuit for forward biasing said pullup transistor circuit, said first drive transistor circuit comprising a pullup output drive transistor coupled in series with said pullup transistor, said pullup output drive transistor having a first high impedance state with a first voltage potential for permitting the slow charge of said pullup transistor to a high logic level, said first drive transistor circuit being coupled to said falling edge detector, said pullup output drive transistor being responsive to said first pulse and having a second low impedance state permitting low impedance connection of said pullup transistor to said high level voltage supply source to permit increased current flow through said pullup transistor resulting in an increased rate of charge of said pullup transistor circuit; and
   g) a second drive transistor circuit disposed between said low level voltage supply source and said pulldown transistor circuit, said drive transistor circuit being coupled to said pulldown transistor circuit for forward biasing said pulldown transistor circuit, said second drive transistor circuit comprising a pulldown output drive transistor coupled in series with said pulldown transistor, said pulldown output drive transistor having a first high impedance state with a first voltage potential for permitting the slow discharge of said pulldown transistor to a low logic level, said second drive transistor circuit being coupled to said rising edge detector, said pulldown output drive transistor being responsive to said second pulse and having a second low impedance state, permitting low impedance connection of said pulldown transistor to said low level voltage supply source to permit increased current flow through said pullup transistor resulting in an increased rate of discharge of said pulldown transistor circuit.

5. An output driver as in claim 4, further comprising:
   a) a first auxiliary output driver coupled to said failing edge detector, said first auxiliary output driver having a first OFF state and a second ON state, said second ON state triggered by said first pulse and for charging said output terminal to a potential approximately equal to said high level voltage supply source potential for a time approximately equal to said first pulse width; and
   b) a second auxiliary output driver coupled to said rising edge detector, said second auxiliary output driver having a first OFF state and a second ON state, said second ON state triggered by said second pulse and for discharging said output terminal to a potential approximately equal to said low level voltage supply potential for a time approximately equal to said second pulse width.

6. An output driver as in claim 4 wherein said pullup and said pulldown transistor circuits are selected from bipolar, CMOS, and BiCMOS devices.

7. An output driver as in claim 5 wherein said pullup and said pulldown transistor circuits are CMOS.

8. An output driver as in claim 4 further comprising a mask programmable array of insulated gate transistors, said insulated gate transistors being selectable for use in at least one of said pullup transistor circuit, said pulldown transistor circuit, said first voltage source, and said second voltage source.

9. An output driver coupled to a high level voltage supply source and a low level voltage supply source, comprising in operative combination:
   a) a drive control circuit for generating first and second control signals responsive to at least one digital input signal, each of said first and second control signals having a first high digital logic level and a second low digital logic level;
   b) a falling edge detector coupled to said drive control circuit for detecting the falling edge of said first control signal for generating thereupon a first pulse having a predetermined pulse width, wherein said falling edge detector is a one-shot circuit;
   c) a rising edge detector coupled to said drive control circuit for detecting the rising edge of said second control signal for generating thereupon a second pulse having a predetermined pulse width, wherein said rising edge detector is a one-shot circuit;
   d) a pullup transistor circuit coupled to said first control signal for providing a high logic level signal to an output in accordance with a predetermined digital logic level of said first control signal, said pullup transistor circuit comprising a pullup transistor;
   e) a pulldown transistor circuit coupled to said second control signal for providing a low logic level signal to an output in accordance with a predetermined digital logic level of said second control signal, said pulldown transistor circuit comprising a pulldown transistor;
   f) a first drive transistor circuit disposed between said high level voltage supply source and said pullup transistor circuit, said drive transistor circuit being coupled to said pullup transistor circuit for forward biasing said pullup transistor circuit, said first drive transistor circuit comprising a pullup output drive transistor drive transistor circuit comprising a pullup output drive transistor coupled in series with said pullup transistor, said pullup output drive transistor having a first high impedance state with a first voltage potential for permitting the slow charge of said pullup transistor to a high logic level, said first drive transistor circuit being coupled to said falling edge detector, said pullup output drive transistor being responsive to said first pulse and having a second low impedance state, permitting low impedance connection of said pullup transistor to said high level voltage supply source to permit increased current flow through said pullup transistor resulting in an increased rate of charge of said pullup transistor circuit; and
   g) a second drive transistor circuit disposed between said low level voltage supply source and said pulldown transistor circuit, said drive transistor circuit being coupled to said pulldown transistor circuit for forward biasing said pulldown transistor circuit, said second drive transistor circuit comprising a pulldown output drive transistor coupled in series with said pulldown transistor, said pulldown output drive transistor having a first high impedance state with a first voltage potential for permitting the slow discharge of said pulldown transistor to a low logic level, said second drive transistor circuit being coupled to said rising edge detector, said pulldown output drive transistor being responsive to said second pulse and having a second low impedance state, permitting low impedance connection of said pulldown transistor to said low level voltage supply source to permit increased current flow through said pullup transistor resulting in an increased rate of discharge of said pulldown transistor circuit.

10. A method for interfacing digital logic circuits to a transmission line having a high capacitive load, comprising:
   a) providing an output driver between each digital logic circuit and the transmission line, the output driver comprising at least one drive transistor circuit disposed between a voltage supply source and a driver circuit and coupled to an output terminal of a digital logic level switching detector, said drive transistor circuit comprising an output drive transistor having a first high impedance state, and a second low impedance state responsive to the presence of a logic level transition voltage swing;
   b) modifying the impedance of said output driver to an impedance equal to approximately the transmission line impedance during a logic level transition voltage swing to provide power transfer between the logic circuit and the transmission line; and
   c) modifying the impedance of said output driver to have a high impedance at all times other than during a logic level transition voltage swing to substantially remove the logic circuit from the transmission line as a load.

11. The method as in claim 10 wherein said output driver further comprises at least one auxiliary output driver, said auxiliary driver having a first normally OFF state, and a second ON state, said ON state responsive to the presence of a logic level transition, said auxiliary driver for charging an output terminal to approximately an output logic level value.

12. The method as in claim 11 further comprising charging the output terminal of the output driver to substantially the output logic level for a time approximately equal the duration of a logic level transition voltage swing, and during a logic level transition voltage swing.

* * * * *